United States Patent
Alaniz et al.

(10) Patent No.: US 7,873,890 B2
(45) Date of Patent: *Jan. 18, 2011

(54) TECHNIQUES FOR PERFORMING A LOGIC BUILT-IN SELF-TEST IN AN INTEGRATED CIRCUIT DEVICE

(75) Inventors: Abel Alaniz, Austin, TX (US); Robert B. Gass, Pflugerville, TX (US); Asher S. Lazarus, Austin, TX (US); Timothy M. Skergen, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 136 days.

This patent is subject to a terminal disclaimer.

(21) Appl. No.: 12/164,699

(22) Filed: Jun. 30, 2008

(65) Prior Publication Data
US 2009/0327824 A1 Dec. 31, 2009

(51) Int. Cl.
*G01R 31/28* (2006.01)
*G01R 31/02* (2006.01)
*G01R 31/26* (2006.01)

(52) U.S. Cl. .................. 714/732; 714/724; 714/726; 714/729; 714/733; 714/736; 714/738; 714/739; 714/742; 324/759; 324/763; 324/765

(58) Field of Classification Search .............. 714/724, 714/726, 729, 732, 733, 736, 738, 739, 742; 324/759, 763, 765
See application file for complete search history.

(56) References Cited

U.S. PATENT DOCUMENTS

| | | | |
|---|---|---|---|
| 4,503,536 A | 3/1985 | Panzer | |
| 4,773,071 A | 9/1988 | Nielsen | |
| 5,506,959 A * | 4/1996 | Cockburn | 714/42 |
| 6,021,514 A | 2/2000 | Koprowski | |
| 7,028,239 B2 | 4/2006 | Jaber | |
| 7,058,869 B2 | 6/2006 | Abdel-Hafez et al. | |
| 7,117,415 B2 * | 10/2006 | Forlenza et al. | 714/733 |
| 7,149,640 B2 | 12/2006 | Lawrence et al. | |
| 7,318,182 B2 * | 1/2008 | Bushard et al. | 714/733 |
| 2005/0034012 A1 | 2/2005 | Bartlett et al. | |

OTHER PUBLICATIONS

Liu et al.; "Compact Dictionaries for Fault Diagnosis in BIST"; Dept. of Electrical & Computer Engineering, Duke University, Durham, NC; Proceedings of the Fourth International Symposium on Quality Electronic Design; IEEE 2003.

* cited by examiner

*Primary Examiner*—John J Tabone, Jr.
(74) *Attorney, Agent, or Firm*—Dillon & Yudell LLP

(57) ABSTRACT

A method, system and computer program product for performing device characterization Logic Built-In Self-Test (LBIST) in an IC device. Test parameters of the LBIST are saved in a memory of the IC device, and nominal operational parameters of the IC device are used to define a signature of the LBIST. A determination whether the LBIST is passed or failed is made within the characterized IC device.

15 Claims, 3 Drawing Sheets

TECHNIQUES FOR PERFORMING A LOGIC BUILT-IN SELF-TEST IN AN INTEGRATED CIRCUIT DEVICE

BACKGROUND

1. Technical Field

The present invention generally relates to integrated circuit devices and in particular to techniques for performing a Logic Built-In Self-Test (LBIST) in an integrated circuit device.

2. Description of the Related Art

As complexity of integrated circuit (IC) devices increases, testing of the IC devices during manufacture and operation thereof has become increasingly more important. One efficient tool for detecting many types of defects in the IC devices is a Logic Built-In Self-Test (LBIST). Presently, the LBIST is commonly used to perform automated comparative analysis of the test data versus pre-determined test patterns ("signatures"). When the test data and the signatures match, the IC device passes the LBIST; otherwise the IC device is considered to be defective.

Conventional techniques for performing the LBIST require multiple communications ("software calls") between a tested IC device and a remote processor administering the LBIST and interpreting the test data. Such communications include transfers of massive volumes of the test data, and limited transmission capabilities of the interfaces between the IC device and remote processor increase the duration of the LBIST. In many instances, duration of the data transfers may exceed the duration of test cycles of the LBIST. The drawbacks of these techniques limit effectiveness of the LBIST in the IC device.

SUMMARY OF ILLUSTRATIVE EMBODIMENTS

Disclosed are a method, system, and computer program product for performing a Logic Built-In Self-Test (LBIST) in an integrated circuit (IC) device.

In embodiments of the present invention, test parameters of the LBIST are saved in a memory of the IC device, and the signature of the LBIST in the IC device is defined by performing a test cycle that uses a pre-selected portion of the test parameters. Device characteristics are determined by sweeping the test parameters and analyzing the test results. A determination whether the device passed or failed the LBIST is made within the IC device by comparing the signature with the results of the test cycles. In exemplary embodiments, the signature of the LBIST is defined during a test cycle in which nominal operational parameters of the IC device (for example, clock frequencies, rail voltages, and the like) are used as the test parameters.

The above as well as additional features and advantages of the present invention will become apparent in the following detailed written description.

BRIEF DESCRIPTION OF THE DRAWINGS

The invention itself will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
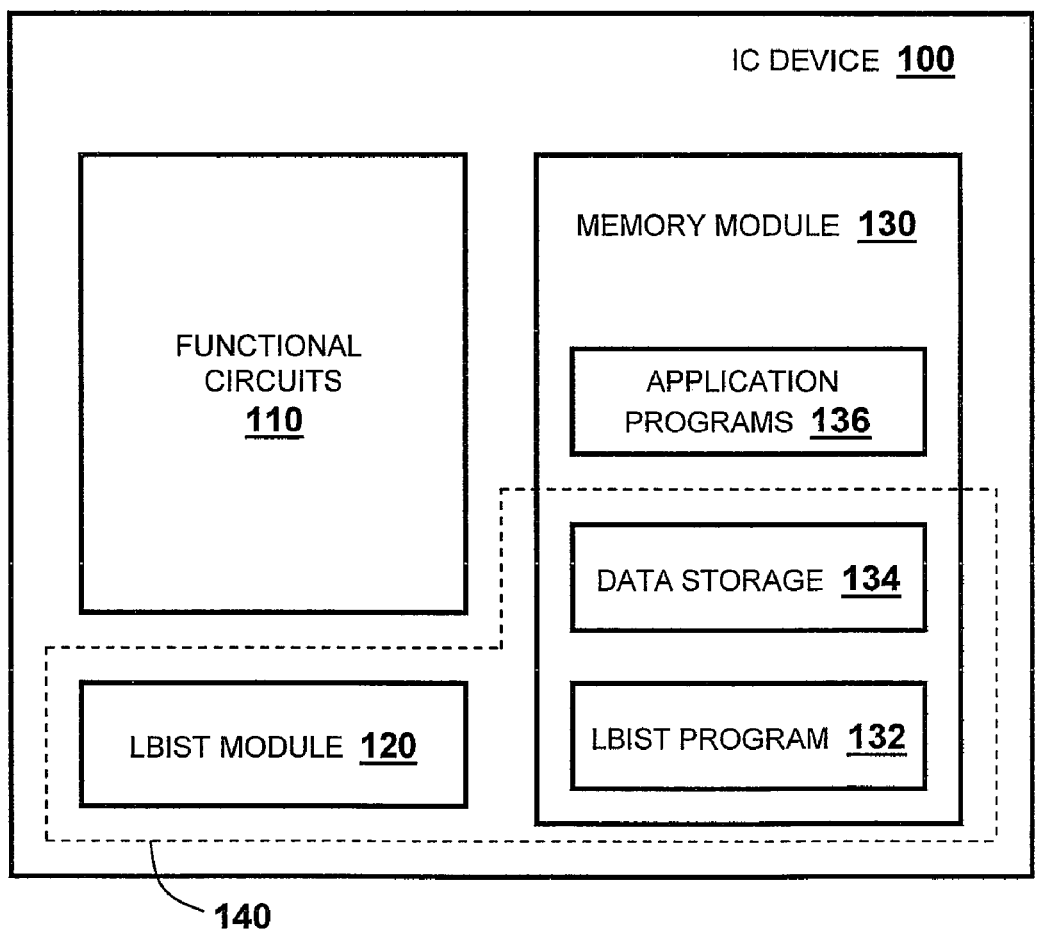
FIG. 1 is a block diagram of an exemplary integrated circuit (IC) device having an LBIST system including hardware and software components configured for implementing one or more embodiments of the invention.

The illustrative embodiments provide a method, system, and computer program product for performing a LBIST in an integrated circuit (IC) device.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical, and other changes may be made without departing from the spirit or scope of the present invention. The following detailed description is, therefore, not to be taken in a limiting sense, and the scope of the present invention is defined only by the appended claims.

Within the descriptions of the figures, similar elements are provided similar names and reference numerals as those of the previous figure(s), except that alphanumeric suffixes may be added, when appropriate, to differentiate such elements. The specific numerals assigned to the elements are provided solely to aid in the description and not meant to imply any limitations (structural or functional) on the invention.

It is understood that the use of specific component, device and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. Specifically, as utilized herein, the term "LBIST" broadly refers to hardware/software products at least in part facilitating a Logic Built-In Self-Test in an IC device.

With reference now to the figures, FIG. 1 depicts a block diagram representation of exemplary IC device 100. IC device 100 generally includes functional circuits 110, LBIST module 120, and memory module 130, which contains LBIST program 132, data storage 134, and optional application programs 134. In operation, resources of data storage 134 are utilized by functional circuits 110, application programs 134, or remote processors (not shown) communicatively coupled IC device 100. Together, LBIST module 120, LBIST program 132, and particular regions of data storage 134 form LBIST system 140 (shown in detail in FIG. 2) of IC device 100. In alternate embodiments (not shown), at least portions of LBIST module 120 and LBIST program 132 may reside externally to IC device 100 (for example, be associated with an external processor).

Functional circuits 110, memory module 130, and LBIST module 120 are connected (not shown) to one another and to external circuits by interfaces provided in IC device 100. IC device 100 may, for example, be a microprocessor, an application-specific IC (ASIC), a field-programmable array (FPA), or a memory array, among other types of IC devices. Correspondingly, memory module 130 may include, but is not limited to, cache memory, random access memory (RAM), read only memory (ROM), firmware memory devices, registers, and buffers, among other storage elements.

LBIST program 132 is illustrated and described herein as a stand-alone (i.e., separate) software/firmware component, which is saved in memory module 130 and provides or supports the specific novel functions discussed below. In alternate embodiments, at least portions of LBIST program 132 may be combined with other software modules incorporating functionality of their respective components. In one illustrative embodiment, LBIST program 132 facilitates in-situ simulation and diagnostics (i.e., testing) of temporal behaviour and/or spatial characteristics of circuit structure of electronic components of IC device 100. In particular, syntax of LBIST program 132 allows testing of combinational, sequential, memory, and other circuits used in IC devices.

Among the software code/instructions provided by LBIST program 132 and which are specific to the invention, are: (i) code for saving test parameters of the LBIST in memory module 130 of IC device 100, (ii) code for performing test cycles of the LBIST in IC device 100, (iii) code for defining a signature of the LBIST using a pre-selected portion of the test parameters, and (iv) code making within IC device 100 a determination whether the device passed or failed the LBIST.

For simplicity of the description, the collective body of the code that enables these various features is referred to herein as LBIST program 132. According to the illustrative embodiment, when IC device 100 executes LBIST program 132, LBIST system 140 initiates a series of functional processes that enable the above functional features, as well as additional features/functionalities that are described below within the context of FIGS. 2 and 3.

Figure 2:
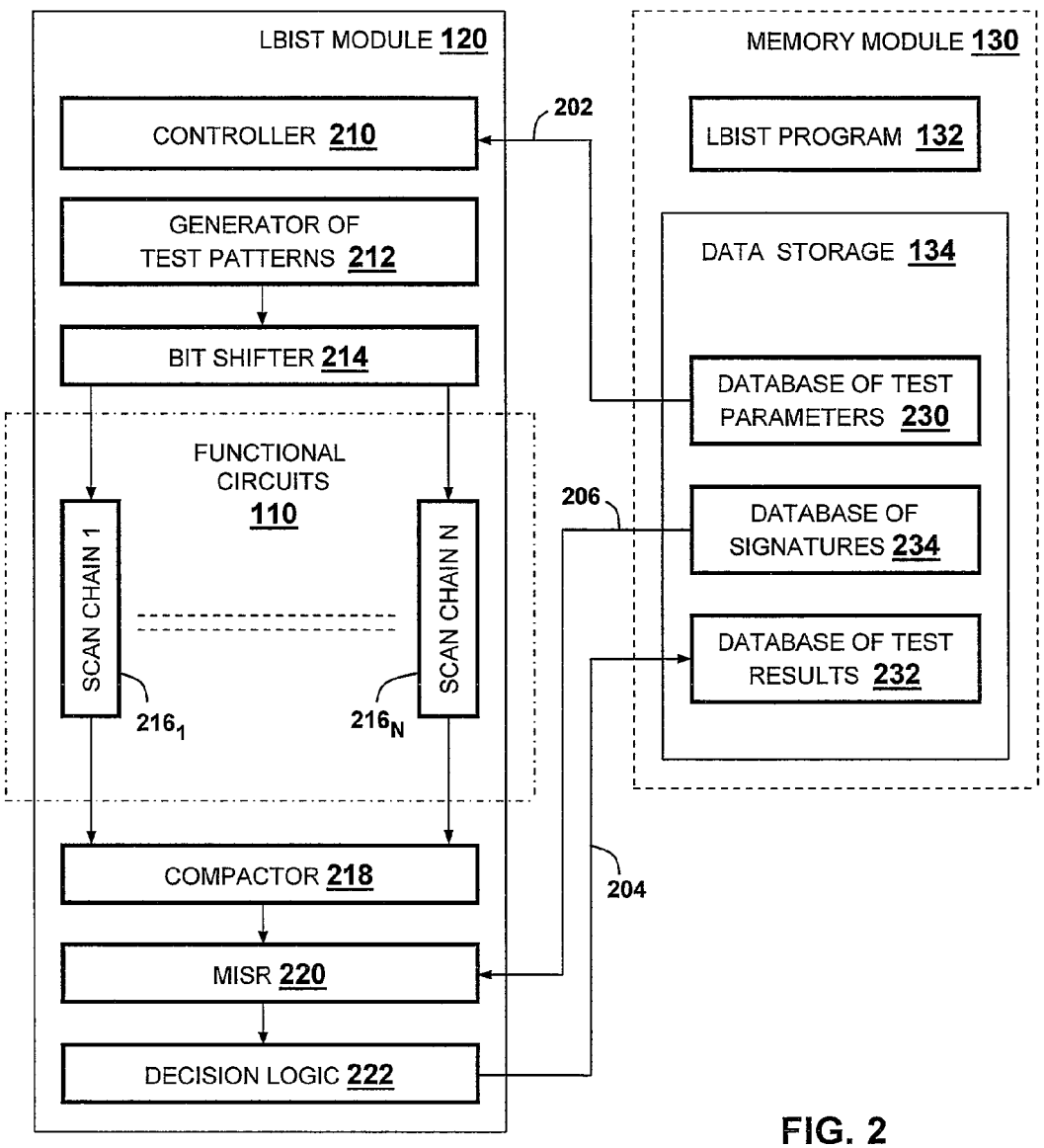
FIG. 2 is a functional block diagram of the LBIST system in which the features of the invention are implemented, according to one embodiment of the invention.

Those of ordinary skill in the art will appreciate that hardware and software configurations depicted in FIGS. 1 and 2 may vary. For example, other hardware or software components may be used in addition to or in place of the depicted components. IC device 100 depicted in FIG. 1 may, for example, be a portion of a larger IC device or a system-on-chip (SoC), system-in-package (SiP), and system-in-module (SiM) device, as well as may incorporate some of such devices or elements thereof. Therefore, the architecture depicted in FIG. 1 is a basic illustration of an IC device, for which actual implementations may vary. Thus, the depicted example is not meant to imply architectural limitations with respect to the present invention.

Figure 3:
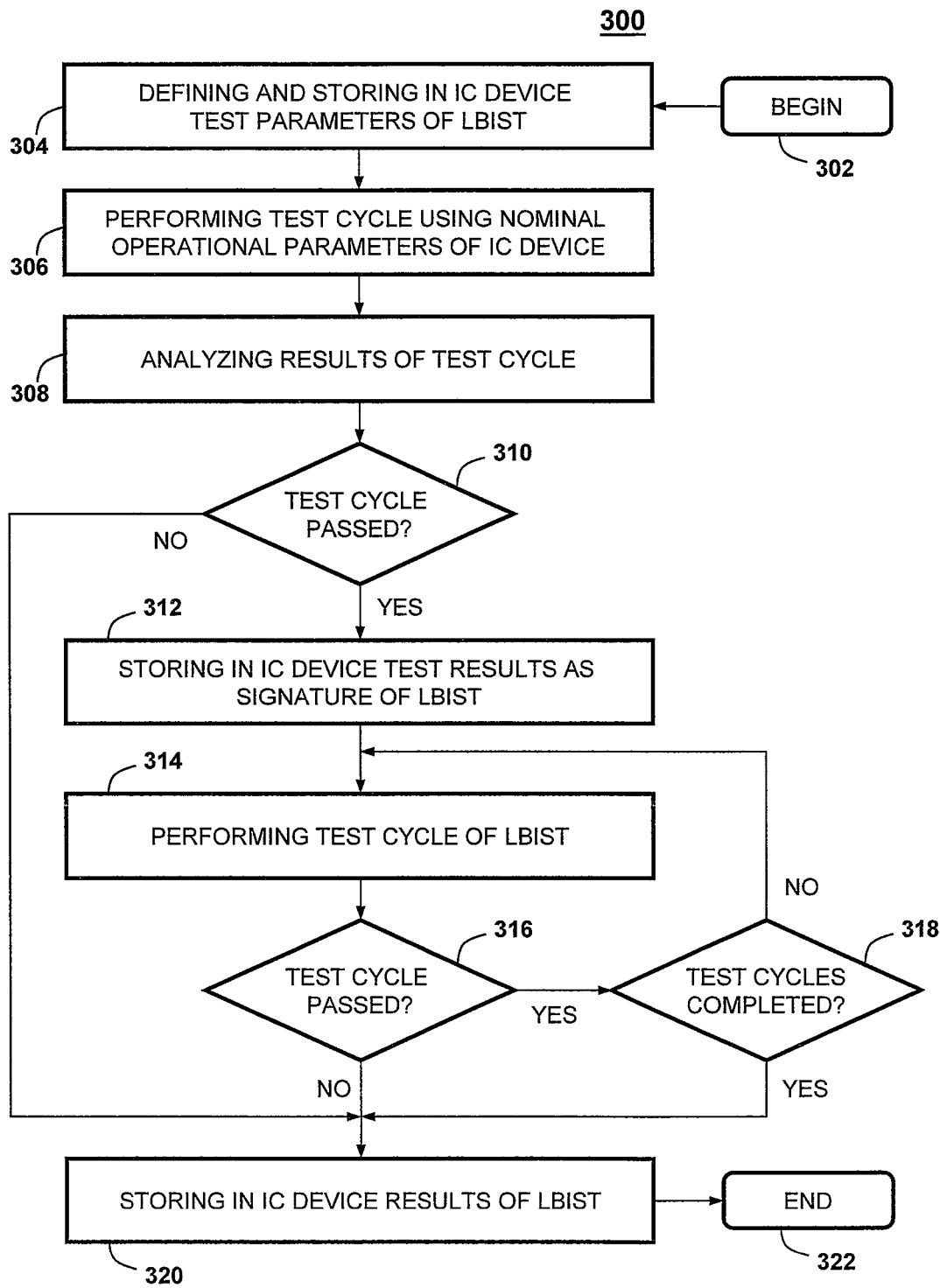
FIG. 3 illustrates a flow chart of a process by which the features of the invention are implemented, according to one embodiment of the invention.

With reference now to FIGS. 2 and 3, therein are described illustrative embodiments of the invention. FIG. 2 illustrates a high-level block diagram of LBIST system 140, in which an embodiment of the invention is implemented, and FIG. 3 is a flow chart illustrating process 300 by which methods of the illustrative embodiments are completed. Although the features illustrated in FIGS. 2 and 3 may be described with reference to components shown in FIG. 1, it should be understood that this is merely for convenience and alternative components and/or configurations thereof can be employed when implementing embodiments of the invention.

Referring to FIG. 2, LBIST system 140 of IC device 100 comprises LBIST module 120, LBIST program 132, and databases 230, 232, and 234 formed in data storage 134 of memory module 130. In some embodiments, databases 230, 232, and 234 are temporal databases, which are used during the LBIST and disassembled thereafter, thus releasing the corresponding regions of data storage 134 back to memory module 130.

LBIST module 120 includes the following functional modules: controller 210, generator 212 of test patterns (i.e., test bit combinations), shifter 214 (optional), scan chains 216, compactor 218, multi-input signature register (MISR) 220, and decision logic 222. In data storage 134, first database 230 and second database 232 contain test parameters and test results of the LBIST, respectively, and third database 234 contains a signature (i.e., exemplary acceptable result) of the LBIST.

Controller 210 includes control circuitry that administers the operation of other modules of LBIST system 140 and, typically, is coupled (not shown) to these modules and to second database 232. In operation, controller 210 retrieves, in a pre-determined order, the test parameters from first database 230 (shown in FIG. 2 with link 202) and facilitates their execution in functional circuits 110 using, for example, components of IC device 100 or external devices.

Generator 212 produces pseudorandom or, alternatively, deterministic test patterns (i.e., test bit combinations), which are processed by shifter 214. While not essential to the LBIST architecture, shifter 214 improves the operation of LBIST system 140 by further randomizing the test patterns. Shifter 214 may be, for example, a linear feedback shift register (LFSR) that produces a plurality of bit-shifted copies of a test pattern. During a test cycle, the inputted bit sequences in adjacent scan chains 216 may be the same, but shifted up or down by one bit.

Scan chains 216 (N scan chains 216 are shown) are defined by circuit designers as representative inputs/outputs for testing operational performance of portions of functional circuits 110 of IC device 100. Typically, scan chains 216 are positioned before and after (i.e., interposed with) respective portions of functional circuits 110 in a manner providing that for each such portion there is (i) a preceding scan chain providing inputs to the components of that portion and (ii) a following scan chain, which receives the outputs of the preceding portion.

After inputted test bit combinations have propagated through components of functional circuits 110, output signals (commonly referred to as "stump data") of scan chains 216 are provided to compactor 218. Compactor 218 compresses the stump data to reduce an amount of information to be processed by MISR 220. In one exemplary embodiment, MISR 220 forwards the signature generated under nominal conditions to the signature storage of third database 234.

MISR 220 is configured to compare a cumulative value of the compressed stump data with the signature stored in third database 234. Correspondingly, decision logic 222 is configured to make a determination whether IC device 100 passed or failed a test cycle of the LBIST. If the cumulative value matches the signature, IC device 100 passes a test cycle of the LBIST; otherwise the IC device 100 fails the test cycle. If decision logic 222 determines that IC device failed a particular test cycle of the LBIST, parameters of the failed cycle are preserved in second database 232 for further analysis (e.g., circuit simulation analysis). Contents of second database 232 may be read out from IC device 100 via, for example, a JTAG (Joint Test Action Group) interface.

Referring to FIG. 3, key portions of process 300 may be completed by LBIST program 132 executed in IC device 100 and controlling specific operations of/in LBIST system 140, therefore the process 300 is described below in the context of either/both IC device 100 and LBIST system 140. The process 300 illustrates the basic operation, upon which additional levels for sweeping through test parameters useful in device characterization may be integrated within the LBIST program with repeated execution of the key portions of the of process 300. To best understand the invention, the reader should refer to FIGS. 2 and 3 simultaneously.

The process 300 of FIG. 3 begins at block 302, in which LBIST program 132 initiates LBIST system 140. At block 304, test parameters of the LBIST are defined and stored in first database 230 of memory module 130. In one embodiment, the test parameters comprise nominal and modified values of clock frequencies and rail voltages that may be used in portions of functional circuits 110 of IC device 100. Additionally or alternatively, the test parameters may include other properties of elements of functional circuits 110. Values of particular test parameters may form, for example, binary or linear test patterns.

At block 306, LBIST system 140 performs a test cycle using the nominal values of operational parameters of the IC device as the test parameters. At blocks 308 and 310, positive execution of the test cycle of block 306 is verified using, for example, controller 210 or, alternatively, a remote processor. If IC device 100 passes the test cycle, process 300 proceeds to block 312. Otherwise, at block 320, parameters of the test cycle are stored (shown in FIG. 2 with link 204) in second database 232 and, at block 322, process 300 ends. However, procedures of blocks 308 and 310 are optional and, in some embodiments, are not performed.

At block 312, results of the test cycle of block 306 (i.e., compressed stump data produced by compactor 218) is saved in third database 234 as a signature of the LBIST. Then, process 300 proceeds to 314, in which a test cycle of the LBIST is performed using a first set of the test parameters, which is derived from first database 230 and processed by controller 210.

At block 316, process 300 queries if a cumulative value of the compressed stump data of the test cycle of block 314 matches the signature of the LBIST provided (shown in FIG. 2 with link 206) by third database 234. If the query is negatively answered, process 300 proceeds to block 320, in which test parameters of the test cycle are stored in second database 232, and then to block 322, where process 300 ends. If the query is answered affirmatively, process 300 proceeds to block 318.

At block 318, process 300 queries if all scheduled test cycles of the LBIST have been completed. If the query is negatively answered, process 300 proceeds back to block 314 to perform a test cycle of the LBIST using other set of the test parameters. Otherwise, process 300 proceeds back to block 320 and then to block 322, where process 300 ends.

Upon completion of process 300, contents of databases 230, 232, and 234 may be accessed for further analysis. In one embodiment, only the test parameters of a most recent passed test cycle of the LBIST are retained in IC device 100, while regions of data storage 134 temporarily occupied by databases 230, 232, and 234 are released back to memory module 130 (e.g., become available for utilization by application programs 134). As has been described, the present invention provides techniques that allow elimination of time-consuming repetitive data transfers between a tested IC device and a remote processor administering the LBIST.

In the flow chart in FIG. 3, one or more of the methods are embodied in a computer readable medium containing computer readable code such that a series of steps are performed when the computer readable code is executed on a computing device. In some implementations, certain steps of the methods are combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be further appreciated, the processes in embodiments of the present invention may be implemented using any combination of software, firmware or hardware. As a preparatory step to practicing the invention in software, the programming code (whether software or firmware) will typically be saved in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage systems containing or having network access to program(s) coded in accordance with the invention.

Thus, it is important that while an illustrative embodiment of the present invention is described in the context of a fully functional IC device with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. By way of example, a non-exclusive list of types of media includes recordable type (tangible) media such as floppy disks, thumb drives, hard disk drives, CD ROMs, DVDs, and transmission type media such as digital and analogue communication links.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for performing a Logic Built-In Self-Test (LBIST) in an integrated circuit (IC) device, the method comprising:

saving test parameters of the LBIST in a memory of the IC device;

performing test cycles of the LBIST;

defining a signature of the LBIST using a pre-selected portion of the test parameters;

storing within said IC device said signature of said LBIST corresponding to said pre-selected portion of the test parameters; and making within the IC device a determination whether said IC device passed or failed the LBIST;

wherein said IC device includes decision logic;

wherein said determination is made by using said signature stored within said IC device and decision logic contained within said IC device.

2. The method of claim 1, further comprising:
using nominal values of operational parameters of the IC device as the test parameters to define the signature of the LBIST.

3. The method of claim 1, further comprising:
comparing in the IC device results of the test cycles with the signature to make the determination.

4. The method of claim 1, further comprising:
selecting the test parameters from the group consisting of clock frequencies and rail voltages of the IC device or portions thereof.

5. The method of claim 1, further comprising:
terminating the LBIST after a failed test cycle.

6. The method of claim 1, further comprising:
retaining in the memory test parameters of a most recent passed test cycle of the LBIST.

7. An integrated circuit (IC) device, comprising:
one or more functional circuits;
a system for performing a Logic Built-In Self-Test (LBIST) of the one or more functional circuits; and
a memory including a code of a program that performs operations including:
saving test parameters of the LBIST in a memory of the IC device;
performing test cycles of the LBIST;
defining a signature of the LBIST using a pre-selected portion of the test parameters;
storing within said IC device said signature of said LBIST corresponding to said pre-selected portion of the test parameters; and
making within the IC device a determination whether said IC device passed or failed the LBIST;
wherein said IC device includes decision logic;
wherein said determination is made by using said signature stored within said IC device and decision logic contained within said IC device.

8. The IC device of claim 7, said device configured to use nominal values of operational parameters of the IC device as the test parameters to define the signature of the LBIST.

9. The IC device of claim 7, said device configured to select the test parameters from the group consisting of clock frequencies and rail voltages of the IC device or portions thereof.

10. The IC device of claim 7, said device configured to (i) compare results of the test cycles with the signature to make the determination, (ii) terminate the LBIST after a failed test cycle, and (iii) retain in the memory test parameters of a most recent passed test cycle of the LBIST.

11. A computer readable storage medium having a computer program product performing a Logic Built-In Self-Test (LBIST) in an integrated circuit (IC) device, said computer readable medium comprising:
computer program code for saving test parameters of the LBIST in a memory of the IC device;
computer program code for performing test cycles of the LBIST;
computer program code for defining a signature of the LBIST using a pre-selected portion of the test parameters;
computer program code for storing within said IC device said signature of said LBIST corresponding to said pre-selected portion of the test parameters; and
computer program code for making within the IC device a determination whether said IC device passed or failed the LBIST;
wherein said IC device includes decision logic;
wherein said computer program code for making said determination is made by using said signature stored within said IC device and decision logic contained within said IC device.

12. The computer readable storage medium of claim 11, further comprising:
computer program code for using nominal values of operational parameters of the IC device as the test parameters to define the signature of the LBIST.

13. The computer readable storage medium of claim 11, further comprising:
computer program code for selecting the test parameters from the group consisting of clock frequencies and rail voltages of the IC device or portions thereof.

14. The computer readable storage medium of claim 11, further comprising:
computer program code for comparing in the IC device results of the test cycles with the signature to make the determination.

15. The computer readable storage medium of claim 11, further comprising:
computer program code for terminating the LBIST after a failed test cycle; and
computer program code for retaining in the memory test parameters of a most recent passed test cycle of the LBIST.

* * * * *